(12) United States Patent
Multhaup et al.

(10) Patent No.: US 7,475,288 B2
(45) Date of Patent: Jan. 6, 2009

(54) ACCELERATED HARDWARE EMULATION ENVIRONMENT FOR PROCESSOR-BASED SYSTEMS

(76) Inventors: Hans Erich Multhaup, Am Wegacker 3, Odelzhausen (DE) 85235; Robert John Bloor, 20 Cross Lane Close, Orwell, Royston, Hertfordshire SG85QW (GB); Duaine Wright Pryor, Jr., 7 Coleman Pl., #4, Menlo Park, CA (US) 94025

( * ) Notice: Subject to any disclaimer, the term of this patent is extended or adjusted under 35 U.S.C. 154(b) by 406 days.

(21) Appl. No.: 10/537,046

(22) PCT Filed: Oct. 5, 2004

(86) PCT No.: PCT/EP2004/052442
§ 371 (c)(1),
(2), (4) Date: Dec. 12, 2005

(87) PCT Pub. No.: WO2006/037374
PCT Pub. Date: Apr. 13, 2006

(65) Prior Publication Data
US 2006/0143522 A1 Jun. 29, 2006

(51) Int. Cl.
*G06F 11/00* (2006.01)
(52) U.S. Cl. ............................ 714/28; 714/35; 703/23
(58) Field of Classification Search ................... 714/28, 714/35; 703/23
See application file for complete search history.

(56) References Cited

U.S. PATENT DOCUMENTS

| | | | |
|---|---|---|---|
| 5,768,567 A | | 6/1998 | Klein et al. |
| 5,771,370 A | | 6/1998 | Klein |
| 5,872,953 A | | 2/1999 | Bailey |
| 6,106,565 A | * | 8/2000 | Stapleton et al. ............. 703/23 |
| 6,212,489 B1 | | 4/2001 | Klein et al. |
| 6,356,862 B2 | | 3/2002 | Bailey |
| 6,377,911 B1 | | 4/2002 | Sample et al. |
| 6,389,379 B1 | * | 5/2002 | Lin et al. ....................... 703/14 |
| 6,470,481 B2 | | 10/2002 | Brouhard et al. |
| 6,571,357 B1 | * | 5/2003 | Martin et al. ................. 714/28 |
| 6,725,391 B2 | * | 4/2004 | Swoboda ..................... 713/500 |

(Continued)

OTHER PUBLICATIONS

Saini, M., "Seamless Co-Verification Accelerates Time to Market," *Xcell Journal*, No. 47, pp. 1-4 (Jul. 15, 2003).

(Continued)

*Primary Examiner*—Marc Duncan
(74) *Attorney, Agent, or Firm*—Klarquist Sparkman, LLP

(57) ABSTRACT

An hardware emulation environment is disclosed wherein software execution is accelerated by switching memory and/or peripheral and clock implementation from the hardware emulator toga faster running processor board coupled to the hardware emulator. A switch is positioned between the hardware emulator and a processor running on the processor board. A design block implemented on a dedicated resource, such as memory or a peripheral, is located on the processor board and is designed to functionally mimic a design block modelled in programmable resources in the hardware emulator. In one embodiment, a user selectively configures a switch to accelerate the software execution by choosing a trigger event, such as a memory range or a software breakpoint. Upon detecting the trigger event, the switch switches the clock and/or bus routing so that the processor communicates directly with the design block on the processor board, rather than with a functionally equivalent design block in the hardware emulator. The processor also is clocked using a faster clock allowing the acceleration of the software execution.

22 Claims, 8 Drawing Sheets

U.S. PATENT DOCUMENTS 7,127,369 B2 * 10/2006 Fukumura et al. ........... 702/150

OTHER PUBLICATIONS

Harris, D. et al., "The Co-Verification of an Rtos in an SOC," Integrated System Design, Verecom Group, Los Altos, CA, vol. 13, No. 143, pp. 23-30 (May 2001).

Klein, R., "Hardware/Software Co-Verification," EmbeddedSystems Conferences, pp. 1-10 (May 12, 2004).

Séméria, L. et al, "Methodology for Hardware/Software Co-verification in C/C==," Design Automation Conference, 2000, Proceedings of the ASP-DAC 2000, Asia and South Pacific Yokohama, Japan Jan. 25-28, 2000, pp. 405-408 (Jan. 25, 2000).

International Search Report (PCT/EP2004/052442).

* cited by examiner

ACCELERATED HARDWARE EMULATION ENVIRONMENT FOR PROCESSOR-BASED SYSTEMS

CROSS REFERENCE TO RELATED APPLICATIONS

This is the U.S. National Stage of International Application No. PCT/EP2004/052442, filed Oct. 5, 2004, which is incorporated herein in its entirety.

FIELD OF THE INVENTION

The present invention generally relates to emulators, and more particularly to hardware emulators used to emulate processor-based systems.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which consumes 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to, superior performance, visibility, flexibility, and accuracy.

A short history of hardware emulation: software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When FPGAs became available in the mid-80's, circuit designers conceived of networking hundreds of FPGAs together in order to map their circuit design onto the FPGAs and the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that most facilitate a particular network configuration. A workstation connects to the hardware emulator for control, input, and output.

Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific.

To further speed up hardware emulation, some of the latest emulators separate a processor board from the hardware emulator allowing for more effective utilization of the hardware emulator. For example, FIG. 1 shows an hardware emulation environment 10 including a processor board 12, a hardware emulator 14, a PC that runs a software debugger 16 (hereinafter called a software debugger host), and an emulator host 18. The processor board 12 generally includes a processor 20 that incorporates on-chip debug facilities, together with processor supporting logic. The processor's on-chip debug facilities are coupled via cabling 22 to the software debugger host 16. Using the software debugger, a system developer can control and debug the system software by setting software breakpoints and monitoring the processor registers. The hardware emulator 14 models part or all of the functions of the DUT and includes multiple field programmable gate arrays (FPGAs) (or processor arrays) that serve as a breadboard for implementing the desired integrated circuit design. More specifically, the emulator host 18 programs the FPGAs with the integrated circuit design being tested and monitors the various hardware components in the system. For example, as shown in FIG. 1, there are generic design blocks 24, 26, such as memory and peripherals, and a system bus 28 connecting the hardware emulator 14 to the processor board 12. The processor 20 is clocked by an emulator clock 30. The hardware emulator includes a design having a memory map that is split into various parts, such as read-only instruction memory (including system BIOS and CPU run-time code), R/W data and stack sections, and memory locations for configuration of peripherals. The emulator host 18 controls and monitors the state and activity of the hardware emulator, including downloading the design and uploading state information. Thus, the hardware emulation environment is used to debug both hardware and software of the design allowing the designer to be more certain that the final SoC produced is fully functional.

However, there are problems with such an hardware emulation system. For example, current hardware emulation systems run from 100 KHz to 1.5 MHz, whereas the actual circuits in silicon run at several hundred megahertz. Of course, a problem with the slower clock speeds of the hardware emulator is that hardware emulation can take several hours, which significantly slows the overall verification process.

One possible solution to speed up the verification process is to skip sections of software that are already well proven. For example, the BIOS of an operating system is generally well established and unnecessary to test again. However, software designers do not want to bypass such sections for fear of missing a state change, which may precipitate an error in the system when in silicon not found during testing. Generally, good engineering principles suggest that the software should be tested in a mode as close as possible to the actual use.

Thus, it is desirable to speed up hardware emulation while maintaining the overall integrity of the testing process.

SUMMARY

The present invention provides a hardware emulation environment wherein software execution is accelerated by switching memory and clock implementation from the hardware emulator to a faster running processor board coupled to the hardware emulator.

A switch, which may be programmable, is positioned between the hardware emulator and a processor running on the processor board. A design block implemented on a dedicated resource, such as physical memory or a physical peripheral, is located on the processor board and is designed to functionally mimic a design block modelled in a programmable resource in the hardware emulator. In one embodiment, a user programs the software debugger with a software breakpoint. Alternatively, the switch may be configured with a memory range. If the software breakpoint is reached or an address within the memory range is accessed, a trigger event occurs. Upon detecting the trigger event, the switch switches the clock and bus routing so that the processor communicates directly with the design block on the processor board, rather than with a functionally equivalent design block in the hardware emulator. The processor also is clocked using a faster clock allowing the acceleration of the software execution.

Synchronization between the design blocks in the hardware emulator and on the processor board allows a seamless transition so that it appears to the software debugger that the processor is always accessing the same design block within the hardware emulator, when, in reality, the processor may be accessing the hardware emulator or the functionally equivalent component on the processor board.

Thus, according to the invention, a method for emulating a design of an integrated circuit is disclosed according to claims 1 and 17 and a system is provided according to claims 10, 19, and 20.

These features and others of the described embodiments will be more readily apparent from the following detailed description which proceeds with reference to the accompanying drawings.

DETAILED DESCRIPTION

Figure 1:
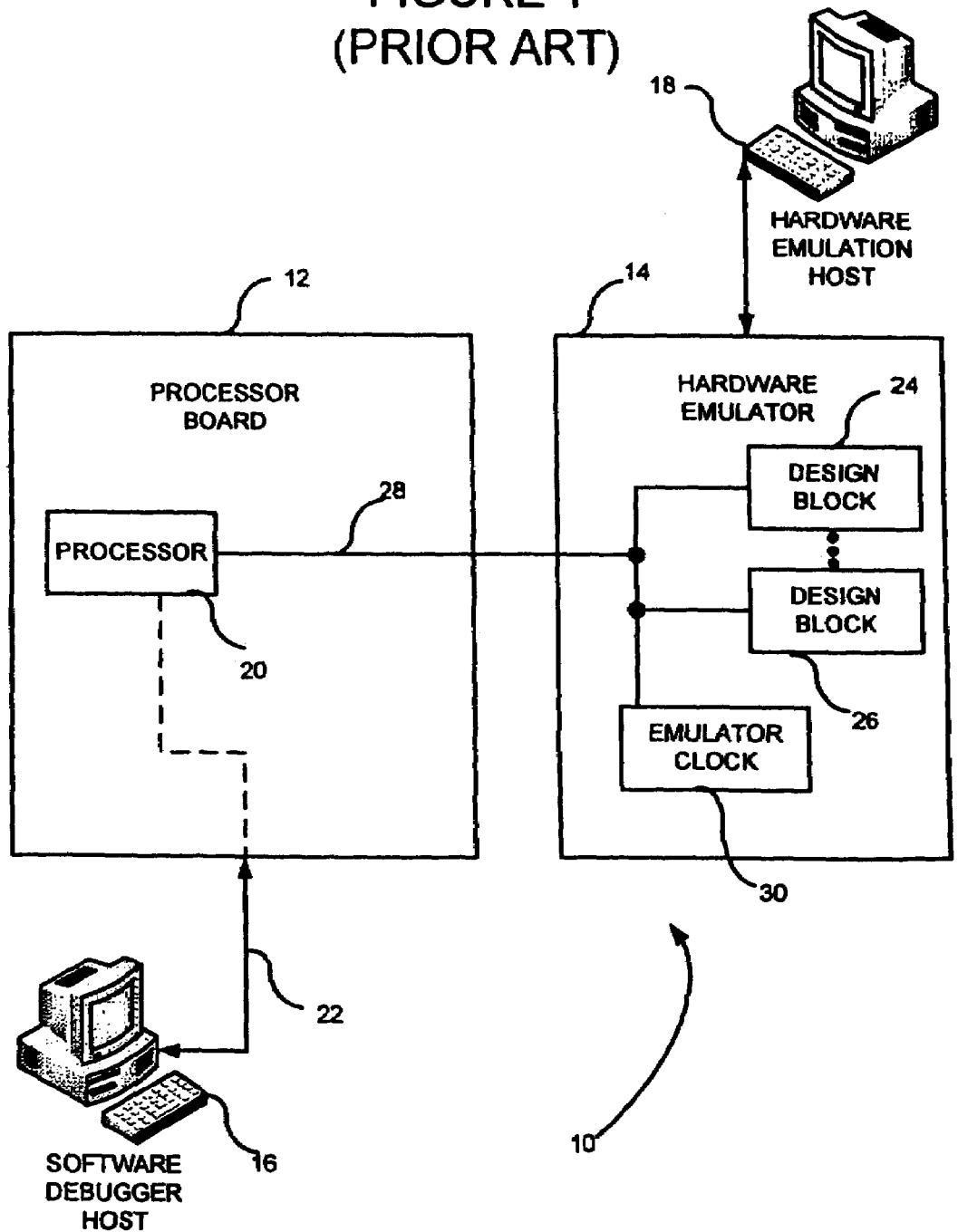
FIG. 1 is a block diagram of a prior art hardware emulation environment.
Figure 2:
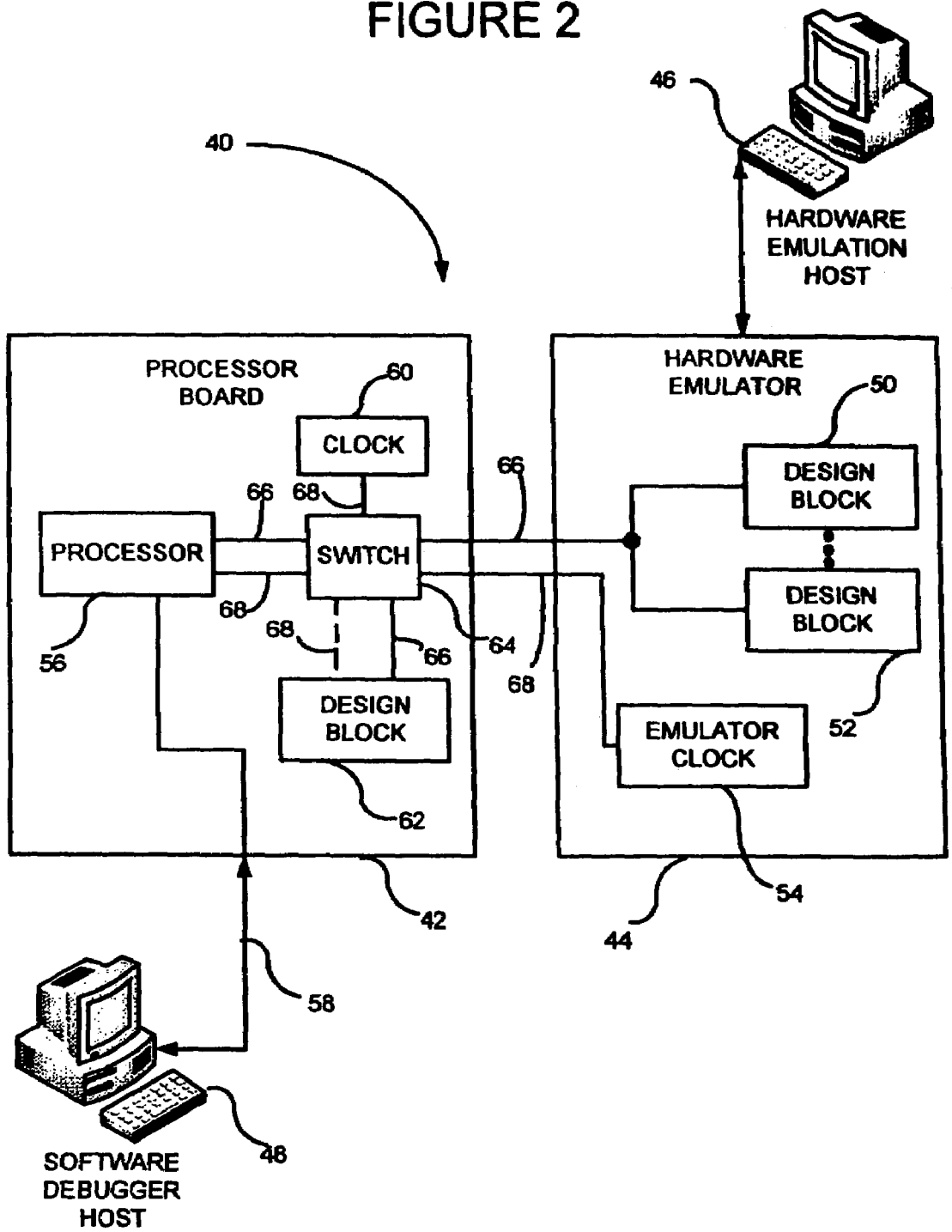
FIG. 2 is a block diagram of an hardware emulation environment including a switch according to the invention.

FIG. 2 shows a hardware emulation environment 40 including a processor board 42, a hardware emulator 44, a hardware emulation host 46, and a software debugger host 48. The hardware emulator 44 is shown with various design blocks 50, 52 (e.g., memory, peripherals, etc.) that are associated with the design loaded into the hardware emulator. The design blocks are generally implemented in FPGAs, but other programmable resources may be used. An emulator clock 54 runs at slow speeds (relative to when the design is in an SoC) and is used to coordinate the timing of the design loaded in the hardware emulator 44. The processor board 42 includes a dedicated processor 56 with on-chip debug facilities having cabling 58 coupling it to the software debugger host 48. A clock 60 is a higher frequency clock than the emulator clock 54 and is used to implement a high-speed mode of operation, as further described below. A local design block 62 is implemented on a dedicated resource and is coupled to the hardware emulator 44. The local design block 62 is designed to functionally imitate or act as one of the design blocks 50, 52 located in the hardware emulator 44 during the high-speed mode of operation, but the local design block includes a dedicated resource (e.g., a physical memory instead of an FPGA programmed to act as a memory). A switch 64 is positioned between the processor 56 and the hardware emulator 44 and controls the switching of a main bus 66 (including address, data lines, and/or other communication lines) and a clock bus 68. The main bus 66 couples the processor 56 to the hardware emulator 44 or-couples the processor to the local design block 62, depending on the configuration of the switch 64. Likewise, the clock bus 68 is used to clock the processor 56 by using either the emulator clock 54 or the local clock 60, depending on the configuration of the switch 64. The clock may also be used to clock the local design block 62, but the clock bus 68 to the design block is shown in dashed lines because it may or may not be necessary depending on the design block type.

Figure 3:
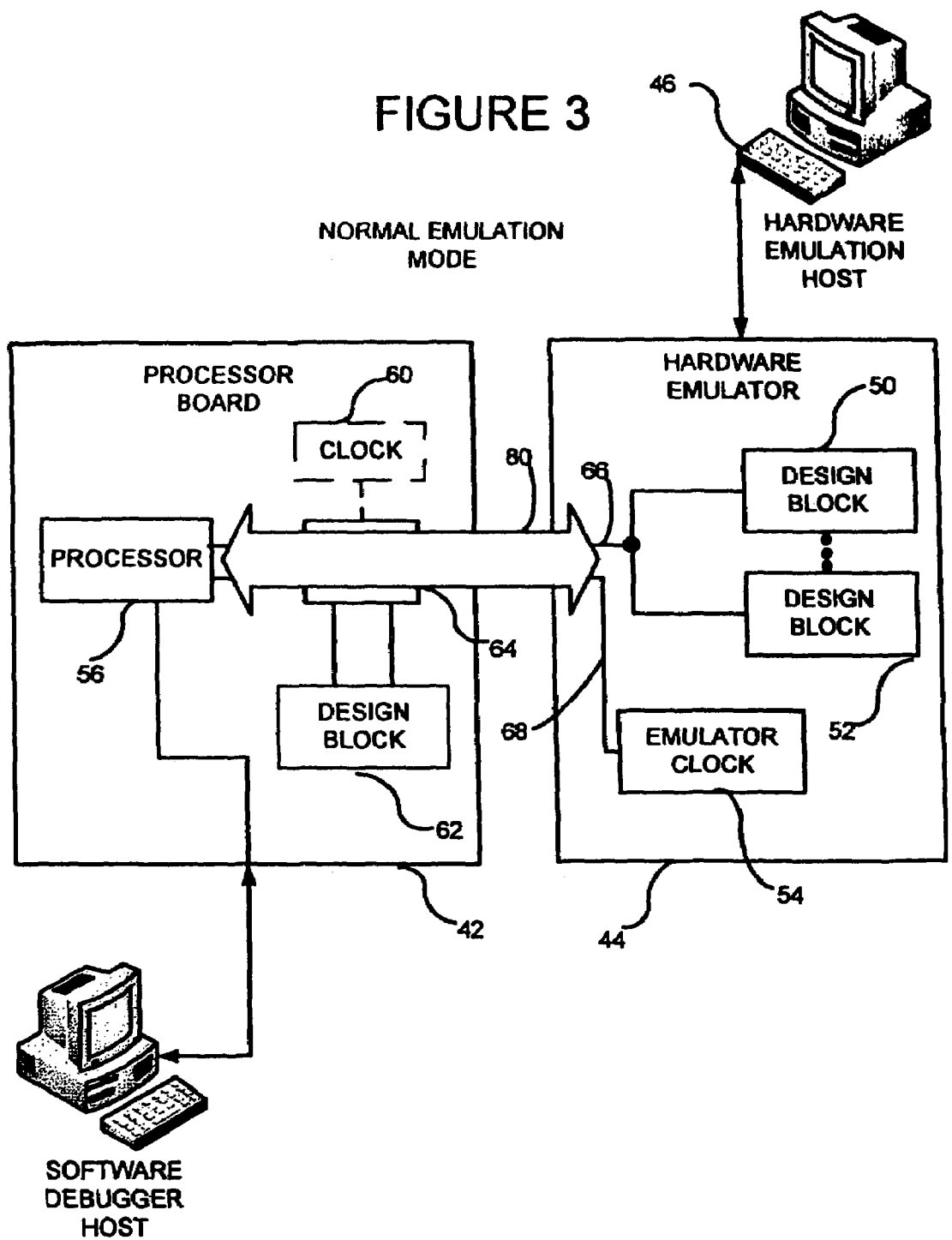
FIG. 3 shows the block diagram of FIG. 2 with the switch configured to set the system in a first mode of operation wherein a processor is coupled to a hardware emulator.
Figure 4:
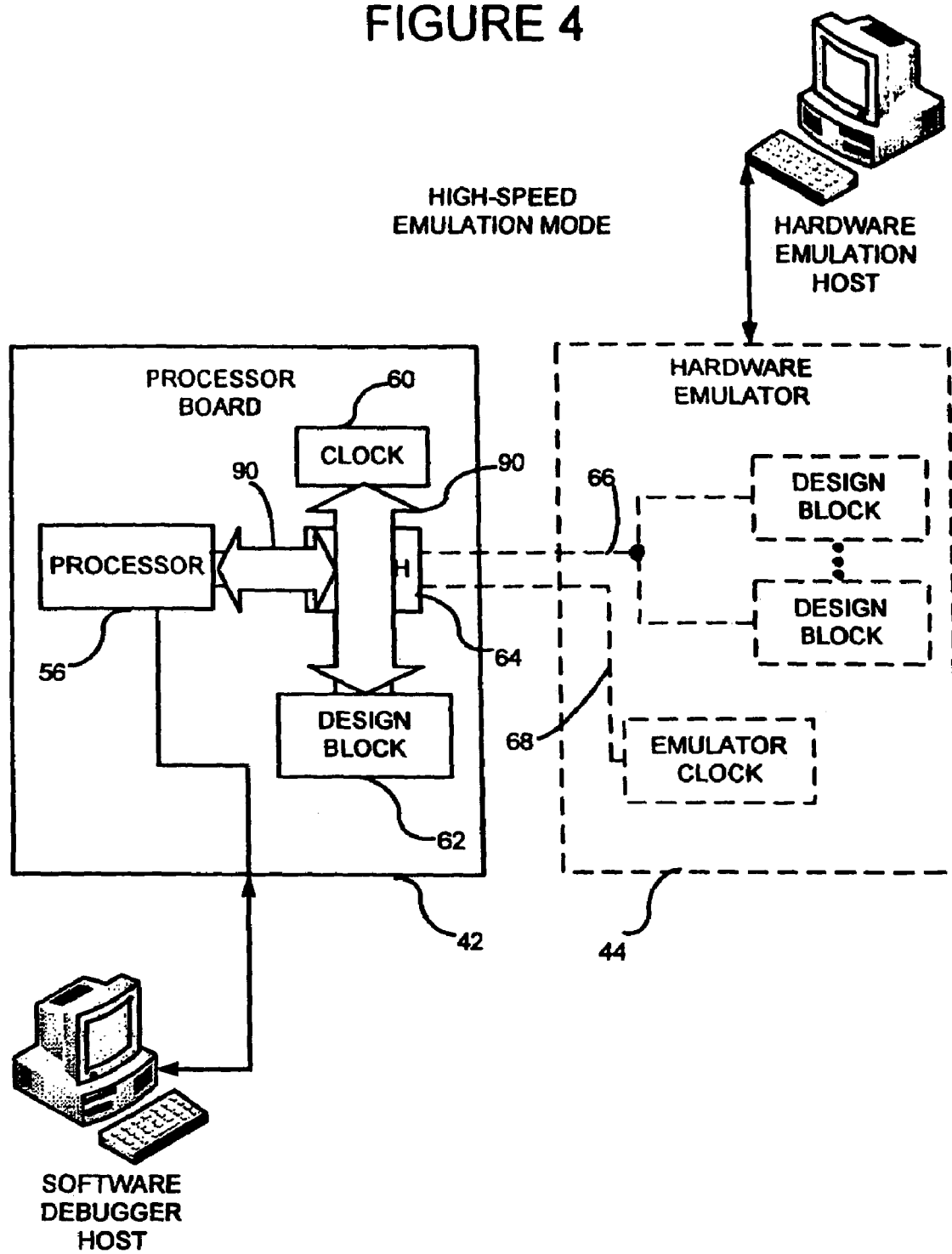
FIG. 4 shows the block diagram of FIG. 2 with the switch configured to set the system in a second mode of operation wherein the processor is coupled to a local clock to accelerate the hardware emulation environment.

FIGS. 3 and 4 show the different switching modes of the emulation environment 10. Specifically, FIG. 3 shows a normal emulation mode where the switch 64 establishes a connection (as shown by arrow 80) between the processor 56 and the hardware emulator 44 via the address and data bus 66 and the clock bus 68. The local clock 60 and the local design block 62 do not communicate directly with the processor 56 during this mode of operation. Thus, the processor 56 is clocked by the emulator clock 54 in a typical emulation mode and the processor 56 addresses the design blocks 50, 52 via bus 66. The normal emulation mode of FIG. 3 is limited by the speed of the emulator clock 54, but there is visibility by the emulation host 46 of all transactions, such as transactions on the address and data bus 66 and the clock bus 68.

FIG. 4 shows a high-speed mode of operation, where the switch 64 switches bus and clocking configuration as shown by arrows 90 so that the processor 56 is clocked by the local clock 60 at a high clock frequency. Additionally, the design block 62 is coupled to the processor via the main bus 66 and, if desired, the clock bus 68. The hardware emulator is shown in dashed lines because in this mode of operation, the hardware emulator is decoupled from the processor 56 by the switch 64. During this mode of operation, the emulation host has no visibility of transactions occurring in the system. But the high-speed mode of operation may be used for those areas of software that have been well tested so that it is unnecessary for the emulation host to have visibility. At the same time, all instructions of code are executed as is desirable in all testing environments.

Figure 5:
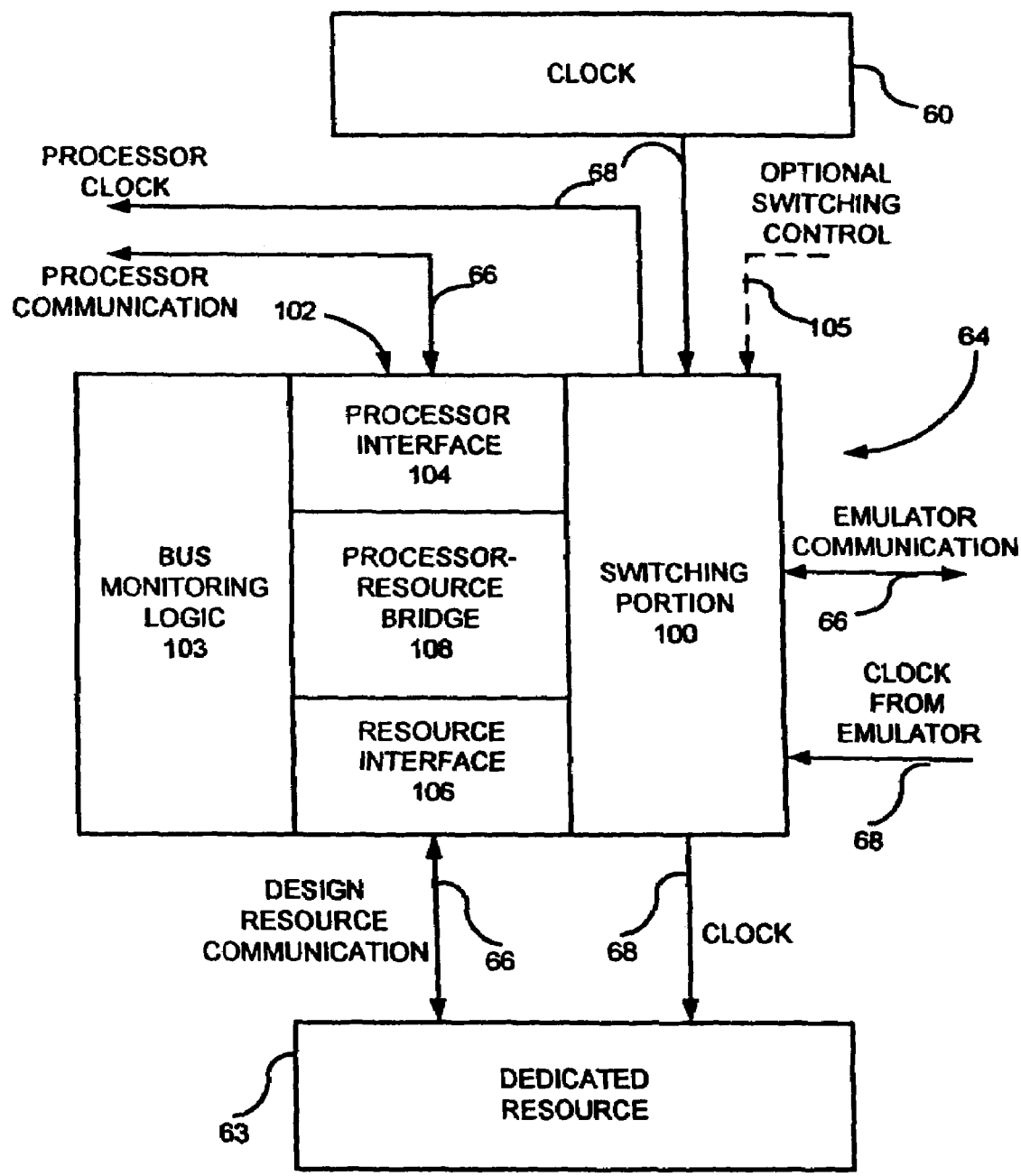
FIG. 5 is a detailed block diagram of the switch of FIG. 2.

FIG. 5 shows the switch 64 in more detail, including a switching portion 100, an interface portion 102, and bus monitoring logic 103. The switch may be implemented in a variety of ways, such as by using an FPGA. The switching portion 100 controls the routing of the main bus 66 and the clock bus 68 (as already described in relation to FIGS. 3 and 4). An optional switching control shown at 105 is provided so that the switch can be externally controlled, such as by hardware on the processor board 42 or by the software debugger. Alternatively, the switching control 105 may be eliminated and the switching portion 100 provided with enough intelligence to determine when to switch. The internal hardware of this switching portion 100 is described further below in relation to FIG. 6. The interface portion 102 allows the processor 56 to communicate with the dedicated resource 63. More specifically, the design block 62 (FIG. 4) may have a different interface than the imitated design block 50 within the hardware emulator. For example, the design block 62 may be implemented using a dedicated resource such as an SDRAM-type memory wherein the design block 50 in the hardware emulator is programmed as a different type of memory having different timing requirements. The interface portion 102 works in conjunction with the dedicated resource 63 to implement the design block 62. Thus, the interface 102 allows the processor to communicate with the local dedicated resource 63 in the same way it communicates with the hardware emulator design block 50. To accomplish this, the interface 102 includes a processor interface 104, a resource interface 106, and a processor-resource bridge 108. The processor interface 104 mimics the protocol and timing used between the processor 56 and the design block 50 in the hardware emulator. Thus, to the processor, the communication does not change when the bus and clocking configuration are switched. The resource interface 106 controls the particular protocol and timing needed to communicate with the dedicated resource 63. The processor-resource bridge 108 converts between the two protocols to allow smooth communication between the processor 56 and the dedicated resource 63. In a simple example, the processor 56 may wish to read a memory location. To accomplish such a read, the processor 56 places an address on the bus and activates the necessary control signals within specified timing requirements. The processor interface 104 of the switch 64 receives the address and control signals and the bridge 108 converts the control signals to those necessary for the dedicated resource 63. The resource interface 106 then communicates the request to the dedicated resource 63. The dedicated resource 63 then returns the data associated with the address through the interface 102 in the same fashion. The bus monitoring logic 103 is used to synchronize the local design block 62 with the design block 50 in the hardware emulator. For example, when the switch 64 is in the first mode of operation with the processor 56 communicating with the hardware emulator 44, the bus monitoring logic 103 watches the main bus 66 for addresses that match addresses in the local design block 62. If there is an address match and the data in an emulator design block 50 is being updated, the bus monitoring logic 103 copies the new data to the local design block 62 at the same address. In this way, the local design block 62 may imitate the emulator design block 50 by having identical contents. Thus, when the switch 64 switches to a faster mode of operation by using the local clock 60, the local design block will already be synchronized. Alternatively, synchronization can be accomplished by copying state elements and/or memory contents from the design block in the emulator to the local design block.

Figure 6:
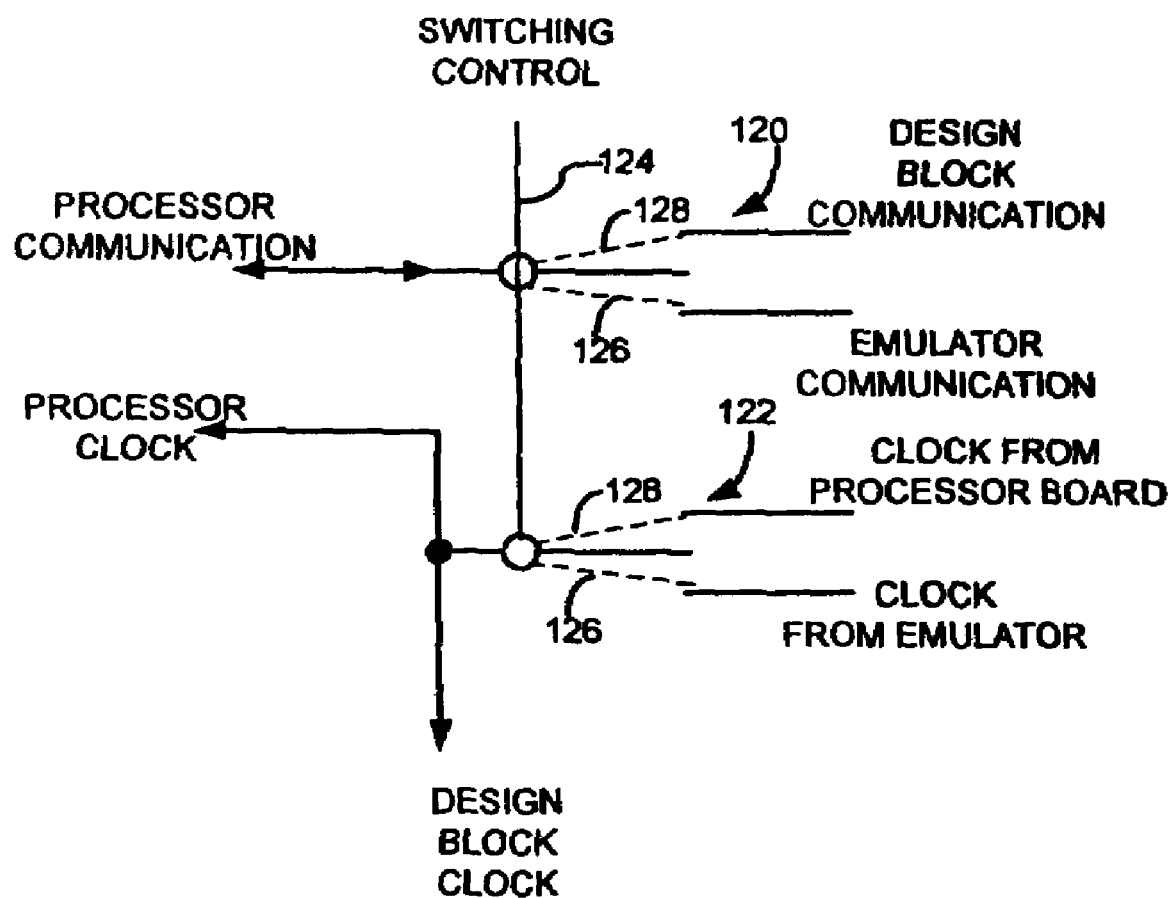
FIG. 6 is a detailed circuit diagram of the switch of FIG. 2.

FIG. 6 shows a circuit diagram of the switching portion 100 including two physical switches 120, 122, with a control line 124 controlling their switching. The switches 120, 122 are shown by a solid line in a neutral position and in dashed lines showing the possible activated positions. If the control 124 moves the switches 120, 122 to the lower positions shown at 126, then the clock 54 from the hardware emulator is coupled to the processor clock terminal and, additionally, the main bus 66 from the hardware emulator is coupled to the processor 56. During this mode, the local clock 60 and the local design block do not communicate directly with the processor. If, however, the control 124 moves the switches to the upper position shown at 128, then the clock 60 from the processor board 42 is coupled to the processor clock terminal and the design block 62 is coupled to the main bus 66. During this mode of operation, the hardware emulator 44 is decoupled from the processor. The switching control 124 is either externally controlled by being coupled to control line 105 (FIG. 5) or internally controlled. When internally controlled, if an address is detected within a predetermined address range, the control signal 124 is generated to change the mode of operation. The address range may be defined by the user through the software debugger, or other means. It should also be noted that although the switching control 124 is shown as only a single control, there may be separate controls for the switches 120 and 122 so that switching of the clocks and switching of the communication may be controlled independently. Such independent control can allow for the possibility to have the emulator clock 54 clock the processor 56 while the processor accesses the local design block 62.

Figure 7:
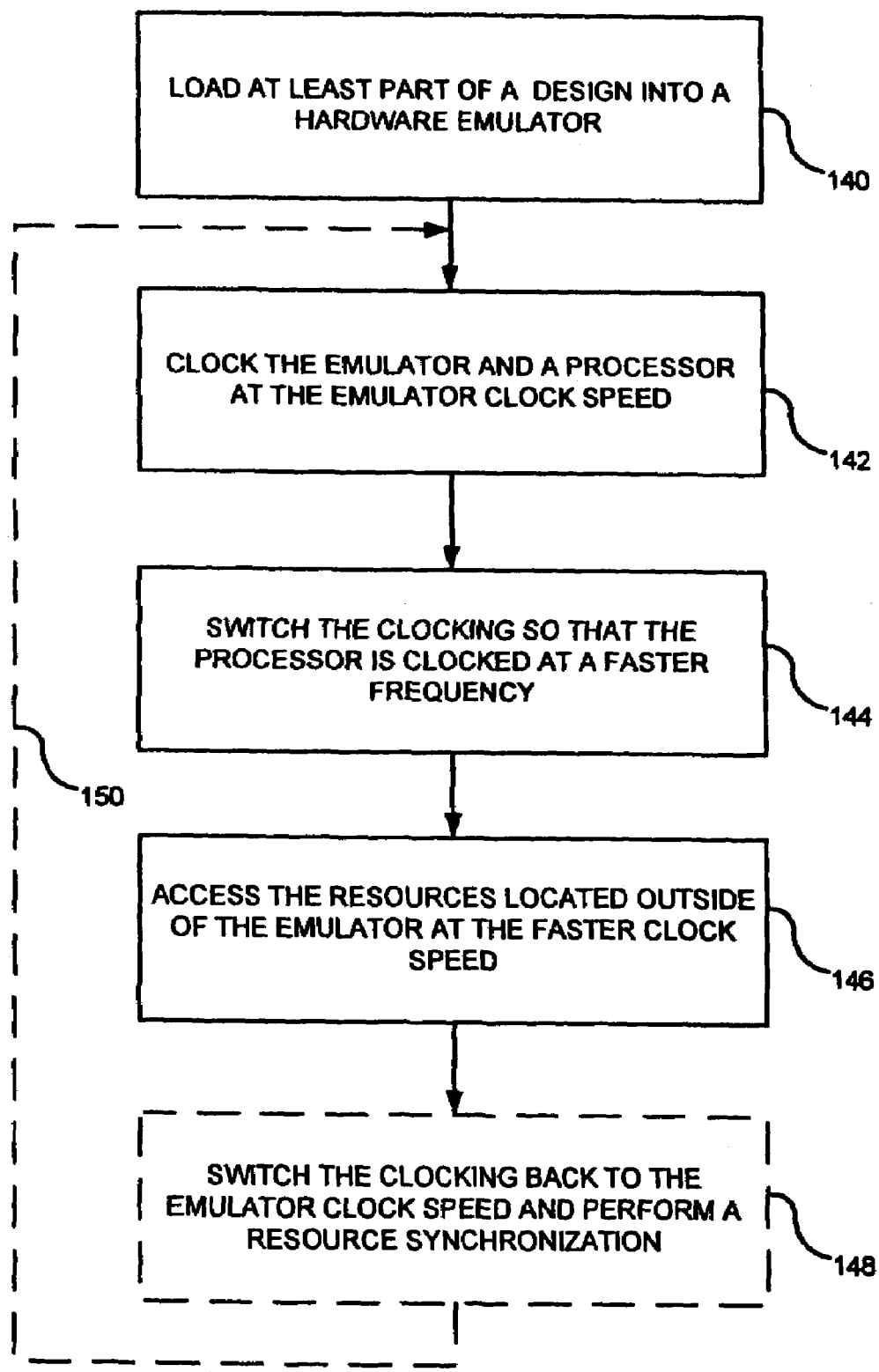
FIG. 7 is a flowchart of a method for performing hardware emulation using the switch of FIG. 2.

FIG. 7 is a flowchart of a method for switching the bus and clock implementation for the emulation system. In process block 140, at least part of the user's design is loaded into the hardware emulator 44. At least one processor portion of the design is not loaded into the hardware emulator as it is implemented as shown in FIG. 2 by the processor 56. In process block 142, the processor 56 and the hardware emulator 44 are clocked using the emulator clock 54, which is a standard operating mode, and which provides high visibility for the emulator host 46. In process block 144, the switch 64 is switched in response to a trigger event, such as detection of a breakpoint or detection that the processor is accessing an address within a predetermined address range. The switching causes the bus and clock implementation to change so that the hardware emulator 44 is decoupled from the processor 56 at substantially the same time that the local clock 60 and local design block 62 are coupled to the processor. This switching places the hardware emulation environment in a high-frequency or accelerated mode of operation. To effectuate a smooth transition it is desirable to either perform the switching at the end of a bus transaction or in an idle state of the bus or by applying well-known clock synchronization mechanisms when switching during a transaction. In process block 146, the processor 56 accesses, at the high frequency of the local clock 60, the dedicated design block that imitates an emulated design block in the hardware emulator. To the processor, the design block 62 appears to be identical to the design block of the hardware emulator. For example, the processor uses the same protocol and same physical address to access the local design block 62 as it would to access the design block 50 in the hardware emulator 44. In the case where the imitated design block is a memory, the memory data within the local design block 62 also is identical to that of the design block of the hardware emulator. Such memory synchronization is accomplished using the bus monitoring described above or other synchronization means well known in the art. Also to the software debugger, the local design block appears identical to the hardware emulator, but the software operates at a higher frequency, and thus a faster speed If desired, in process block 148, the switch switches the bus and clock implementation back to the slower speed that uses the emulation clock 54. Such switching may again be the result of entering or leaving a predetermined address range. A resource synchronization must be performed to update the memory of the imitated design block 50 within the hardware emulator with new data written in the local design block 62. Such synchronization is accomplished by copying the memory contents that have changed from the design block 62 to the design block within the hardware emulator. Also, as shown at dashed line 150 (to emphasize an optional feature), the process may continue in a loop so that switching back and forth between modes may be implemented. Other optional features may also be shown in solid lines.

Figure 8:
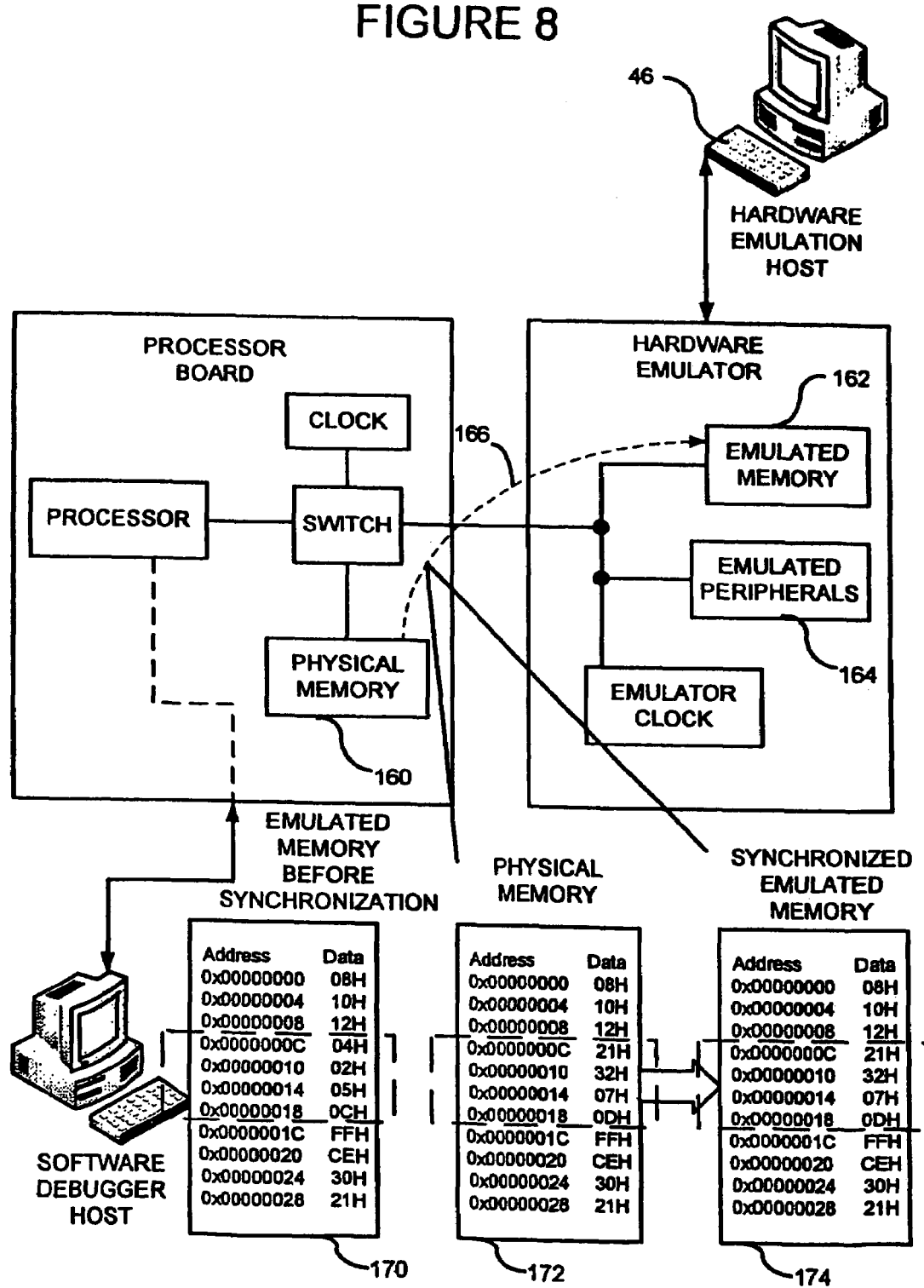
FIG. 8 is a block diagram showing the synchronization when switching modes using the switch of FIG. 2.

FIG. 8 shows a block diagram of the synchronization process where the switch 64 is switched from the accelerated mode back to a normal mode of operation. In the normal mode of operation the processor 56 is clocked by the emulator clock 54. For purposes of illustration, a memory 160 is shown as the local dedicated resource and the design blocks in the hardware emulator 44 are shown as an emulated memory 162 and emulated peripherals 164. The peripherals can be any of a number of peripherals, such as any type of computer I/O, a base station design for cellular phone systems, anything using communication protocols, or an I/O connection scheme, such as USB, Ethernet, and PCI. As shown by arrow 166, the contents of the physical memory 160 are copied to the emulated memory 162 for synchronization. Such synchronization is necessary because during the high-speed mode of operation, the processor 56 updates various locations of the physical memory 160, while the emulated memory 162 is not updated. In order to ensure that the integrity of the system is maintained, the emulated memory 162 must be updated because to the processor 56 both memories 160, 162 are identical, including their physical addresses. As shown at 170 and 172, the emulated memory 162 has different memory contents than the physical memory 160. As shown at 174, after synchronization, the emulated memory 162 has identical contents to the physical memory. There are many different ways such synchronization can be carried out. For example, a processor within the hardware emulator can access physical memory 160 and copy it to the emulated memory. Or the emulation host 46 may have either direct access or indirect access to the contents of the physical memory 160 and update the emulated memory 162.

Having illustrated and described the principles of the illustrated embodiments, it will be apparent to those skilled in the art that the embodiments can be modified in arrangement and detail without departing from such principles.

For example, although the local clock and the emulator clock are shown as separate clocks, they may be derived from the same clock source. Alternatively, they may be derived from different, asynchronous clock sources. Also the location of the clocks may vary based on the design. For example both clocks may be located within the emulator, external to the emulator or a mixture of the two. Still further, the processor can be any type of processor including a digital signal processor (DSP). Additionally, although the high-speed clock and the local design block are shown positioned on the processor board, they may be located anywhere conceptually separated from the hardware emulator. And still further, although the processor board is said to be coupled to the hardware emulator, it may be physically located within the hardware emulators housing or external to the hardware emulator's housing. The hardware emulator is generally defined as a circuit that models other circuits by means of programmable logic. In the present invention the processor board has a dedicated processor rather than modelling the processor by means of programmable logic of the hardware emulator (e.g., in FPGAs). Likewise, the dedicated resource on the processor board is a dedicated part (not part of the standard hardware emulator programmable structure) and may be located physically within or outside of the emulator housing. Thus, it may be said that the processor or dedicated resource are "outside" of the emulator, which is not to be construed as the physical location, but rather as meaning outside of the normal programmable logic of the emulator. Still further, although the software debugger is shown on a separate computer, it may be hosted on the hardware emulator host. Or a program to configure the switch separate from the software debugger may be used. Yet still further the address and data bus is described generically and may include multiple address and data buses as well as control signals. And still further, although the design block implemented on the dedicated resource is said to imitate a design block in the hardware emulator, it may only have the same address range, but be a subset of design-block functionality. On the other hand, it may also be a superset of the design-block functionality (e.g., a real peripheral whereas in the hardware emulator there is a set of registers at that same address location). It should also be recognized that the processor is part of the verification environment and may be part of the DUT or may only interface with the DUT. Additionally, although the trigger event is described as a software breakpoint or detection that the processor is accessing an address range, the trigger event can take any desired form depending on the desired implementation. For example, the trigger event can be generated by a state machine that takes inputs from the processor board and/or emulator, and possibly the software state. Still further, when switched into the high-speed mode of operation, the emulator clock may be stopped. Alternatively, the emulator clock may continue, but in any case when the system switches back to using the emulator clock, there should be a resynchronization of any state elements. And finally, although resynchronization refers primarily to memory elements, state elements of any state machine may also need to be resynchronized.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

The invention claimed is:

1. A method for emulating a design of an integrated circuit, comprising:

loading at least a part of a design of the integrated circuit into a hardware emulator;

clocking the hardware emulator at a first clock frequency in a first mode of operation;

clocking a processor coupled to the hardware emulator at the first clock frequency in the first mode of operation;

upon detection of an event, switching to a second mode of operation wherein the processor is clocked at a second clock frequency, faster than the first clock frequency; and in the second mode of operation, using the processor to access a design block implemented on a dedicated resource that imitates a design block modelled in a programmable resource in the hardware emulator.

2. The method of claim 1, wherein the detection of the event includes comparing an address accessed by the processor to a predetermined address or address range.

3. The method of claim 1, further including coupling a software debugger to the processor and wherein the detection of the event includes hitting a software breakpoint in the software debugger.

4. The method of claim 1, wherein the clocking in the first mode of operation is supplied from a clock in the hardware emulator and wherein the clocking in the second mode of operation is supplied from a clock outside of the hardware emulator.

5. The method of claim 1, wherein the design block includes a memory or a peripheral.

6. The method of claim 1, further including switching back from the second mode of operation to the first mode of operation, and synchronizing between the design block implemented on the dedicated resource and the design block modelled in the programmable resource located within the hardware emulator.

7. The method of claim 6, wherein the dedicated resource includes memory and wherein the synchronizing includes copying from a first dedicated memory to a second memory location within the hardware emulator, wherein the first and second memory locations have the same physical address.

8. The method of claim 6, wherein the synchronizing includes copying state elements from the design block on the dedicated resource to the design block modelled in the programmable resource located within the hardware emulator.

9. The method of claim 1, further including monitoring a bus positioned between the processor and the hardware emulator by, in the first mode of operation, automatically and transparently updating the design block implemented on the dedicated resource when the corresponding design block modelled in the programmable resource within the hardware emulator is updated.

10. The method of claim 1, further including configuring a memory map wherein a first section of the memory map accesses the design block modelled in the programmable resource in the hardware emulator and the second section of the memory map accesses the design block implemented on the dedicated resource.

11. The method of claim 1, wherein the dedicated resource includes a first memory location and the switching to a second mode of operation includes copying from a second memory location within the hardware emulator to the first memory location and wherein the first and second memory locations have the same physical address.

12. The method of claim 1, wherein the switching to a second mode of operation includes copying state elements from the design block modelled in the programmable resource located within the hardware emulator to the design block implemented on the dedicated resource.

13. An hardware emulation environment to emulate an integrated circuit design, comprising:
a processor coupled to an address and data bus;
a hardware emulator used to emulate the integrated circuit design coupled to the address and data bus;
at least first and second clocks running at different frequencies;
a dedicated resource positioned outside of the programmable resources of the hardware emulator and coupled to the address and data bus; and
a switch coupled to the first and second clocks, the dedicated resource, and coupled to the address and data bus between the processor and the hardware emulator, the switch connected to either couple in a first mode of operation the first clock to the processor and couple the processor to the hardware emulator via the address and data bus, or, instead, couple in a second mode of operation the second clock to the processor and couple the processor to the dedicated resource via the address and data bus.

14. The hardware emulation environment of claim 13, wherein the first and second clocks are generated from the same clock source.

15. The hardware emulation environment of claim 13, further including a software debugger host coupled to the processor and a hardware emulation host coupled to the hardware emulator.

16. The hardware emulation environment of claim 13, wherein the switch further includes logic to adapt an address and bus protocol of the processor to an address and bus protocol of the dedicated resource.

17. The hardware emulation environment of claim 13, wherein the dedicated resource is a memory or peripheral device.

18. The hardware emulation environment of claim 13, wherein the switch includes bus monitoring logic designed to read data from the data bus written for the hardware emulator and write such data to the dedicated resource in the first mode of operation.

19. The hardware emulation environment of claim 13, further including synchronization logic that copies memory contents from the dedicated resource located outside the emulator to a programmable resource within the emulator having the same physical address.

20. A method of emulating a design of an integrated circuit, comprising:
loading at least part of the design into the hardware emulator;
configuring a memory map wherein a first section of the memory map accesses resources on the hardware emulator and a second section of the memory map accesses resources on a processor board;
in a first mode of operation, clocking the processor board and the emulator using a first clock frequency;
monitoring a communication to access a dedicated resource modelling a function mapped to a memory address; and
if the memory address is within the second section of the memory map, switching to a second mode of operation wherein the processor board is clocked at a second clock frequency, faster than the first clock frequency.

21. The method of claim 20, further including:
imitating a design block modelled in programmable resources within the emulator with a design block implemented on the dedicated resource outside of the emulator, each having the same physical address; and
accessing from a processor on the processor board the design block within the emulator in the first mode of operation and, in the second mode of operation, accessing from the processor the equivalent design block outside of the emulator.

22. A hardware emulation environment for emulating a design of an integrated circuit, comprising:
a hardware emulator having an emulator clock;
a processor located on a processor board coupled to the hardware emulator having a processor clock, faster than the emulator clock;
a bus coupling together the hardware emulator and the processor;

at least two components having a same functionality and a same physical address, one of the components within the emulator and other of the components located on the processor board; and a switch coupled between the processor and the emulator that switches the bus routing and clocking to switch the processor from accessing the component on the emulator using the emulator clock to accessing the component on the processor board using the processor clock.

* * * * *